United States Patent
Russell et al.

(10) Patent No.: US 8,709,944 B2
(45) Date of Patent: *Apr. 29, 2014

(54) METHOD TO ALTER SILICIDE PROPERTIES USING GCIB TREATMENT

(71) Applicant: TEL Epion Inc., Billerica, MA (US)

(72) Inventors: Noel Russell, Waterford, NY (US); John J. Hautala, Beverly, MA (US); John Gumpher, Niskayuna, NY (US)

(73) Assignee: TEL Epion Inc., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/888,981

(22) Filed: May 7, 2013

(65) Prior Publication Data
US 2013/0230984 A1  Sep. 5, 2013

Related U.S. Application Data

(63) Continuation of application No. 13/482,550, filed on May 29, 2012, now Pat. No. 8,435,890, which is a continuation of application No. 12/873,573, filed on Sep. 1, 2010, now Pat. No. 8,187,971.

(60) Provisional application No. 61/261,417, filed on Nov. 16, 2009.

(51) Int. Cl.
*H01L 21/20* (2006.01)

(52) U.S. Cl.
USPC ........... 438/659; 438/672; 438/673; 438/692; 438/723; 438/724

(58) Field of Classification Search
USPC .................. 438/659, 672, 673, 692, 723, 724
See application file for complete search history.

(56) References Cited

U.S. PATENT DOCUMENTS

| | | |
|---|---|---|
| 5,990,493 A | 11/1999 | Gardner et al. |
| 6,072,222 A | 6/2000 | Nistler |
| 7,060,989 B2 | 6/2006 | Swenson et al. |
| 7,173,252 B2 | 2/2007 | Mack |
| 7,232,756 B2 | 6/2007 | Ku et al. |
| 7,553,763 B2 | 6/2009 | Hsiao et al. |
| 7,709,344 B2 | 5/2010 | Chen et al. |
| 7,745,324 B1 | 6/2010 | Yang et al. |
| 2005/0277246 A1 | 12/2005 | Kirkpatrick et al. |
| 2006/0199285 A1 | 9/2006 | Chidambaram et al. |
| 2007/0037373 A1 | 2/2007 | Hsiao et al. |
| 2009/0020757 A1 | 1/2009 | Lo et al. |
| 2009/0085211 A1* | 4/2009 | Robison et al. ............ 257/751 |

OTHER PUBLICATIONS

U.S. Patent and Trademark Office, Non-final Office Action issued in related U.S. Appl. No. 13/888,924, filed Jul. 19, 2013, 13 pp.

* cited by examiner

*Primary Examiner* — Luan C Thai
(74) *Attorney, Agent, or Firm* — Wood, Herron & Evans, LLP

(57) ABSTRACT

A method of manufacturing a semiconductor device is described. The method comprises performing a gas cluster ion beam (GCIB) pre-treatment and/or post-treatment of at least a portion of a silicon-containing substrate during formation of a silicide region.

17 Claims, 11 Drawing Sheets

METHOD TO ALTER SILICIDE PROPERTIES USING GCIB TREATMENT

CROSS-REFERENCE TO RELATED APPLICATIONS

This application is a continuation of U.S. Pat. No. 8,435,890 issued May 7, 2013 and entitled METHOD TO ALTER SILICIDE PROPERTIES USING GCIB TREATMENT, which is a continuation of U.S. Pat. No. 8,187,971 issued May 29, 2012 and entitled METHOD TO ALTER SILICIDE PROPERTIES USING GCIB TREATMENT, which claims the benefit of and priority to U.S. Provisional Application No. 61/261,417, filed Nov. 16, 2009, the disclosures of which are incorporated herein by reference in their entirety as if completely set forth herein below.

BACKGROUND OF THE INVENTION

1. Field of Invention

The invention relates to a method for fabricating semiconductor devices and, more particularly, a method for altering the material properties of a silicide structure using a gas cluster ion beam (GCIB).

2. Description of Related Art

As the integration density of semiconductor devices continues to increase and the critical dimensions associated with such devices continue to decrease, there has been a corresponding increase in interest in identifying materials and processes for producing low resistance materials that maintain or reduce signal delay. Silicide and salicide (self-aligned silicide) materials and processes have been widely used to lower the sheet resistance and contact resistance for the gate conductor and source/drain regions of MOS devices.

A number of metals, including tungsten, tantalum, zirconium, titanium, hafnium, platinum, palladium, vanadium, niobium, cobalt, nickel and various alloys of such metals have been used to form silicide layers on semiconductor devices. Nickel and nickel alloy, such as Ni(Pt), are attractive metals for forming silicides because the annealing process required to form the desired silicide may be conducted at a relatively low temperature, e.g., below about 550 degrees C. (Celsius). Depending on the reaction conditions, nickel can react with silicon to form dinickel monosilicide ($Ni_2Si$), nickel silicide (NiSi), or nickel disilicide ($NiSi_2$), as the silicidation product. Nickel silicide (NiSi), however, provides the lowest sheet resistance of the three nickel silicide phases.

Defectivity and thermal stability issues with NiSi and Ni(Pt)Si can limit the performance, yield and/or reliability of advanced CMOS devices. Many approaches have been used in the past to improve defectivity and thermal stability issues, including pre-amorphization implant (PAI), pre-clean, ion implant of various species, and composition adjustment of deposited metal used to form the silicide. These approaches are generally aimed at modifying the formation kinetics and/or the thermal stability of the NiSi phase relative to the $NiSi_2$ phase that can form defects and cause shorting. With many of these approaches, there are tradeoffs between yield/reliability and resistance/performance.

SUMMARY OF THE INVENTION

The invention relates to a method for fabricating semiconductor devices and, more particularly, a method for altering the material properties of a silicide structure using a gas cluster ion beam (GCIB).

According to one embodiment, a method for silicide formation on a substrate is described. The method comprises: irradiating at least a portion of a substrate with a first GCIB to modify, amorphize, and/or dope the portion of the substrate; depositing a metal-containing layer over the portion of the substrate following the irradiating with the first GCIB; reacting the metal-containing layer with the portion of the substrate to form a silicide region; and irradiating the portion of the substrate with a second GCIB following the depositing of the metal-containing layer.

According to another embodiment, a method for silicide formation on a substrate is described. The method comprises irradiating at least a portion of a substrate with a GCIB to modify, amorphize, and/or dope the portion of the substrate, wherein the GCIB contains Si. The method further comprises depositing a metal-containing layer over the portion of the substrate following the irradiating with the GCIB, and reacting a portion of the metal-containing layer with the portion of the substrate to form a silicide region.

DETAILED DESCRIPTION OF SEVERAL EMBODIMENTS

Figure 1A:
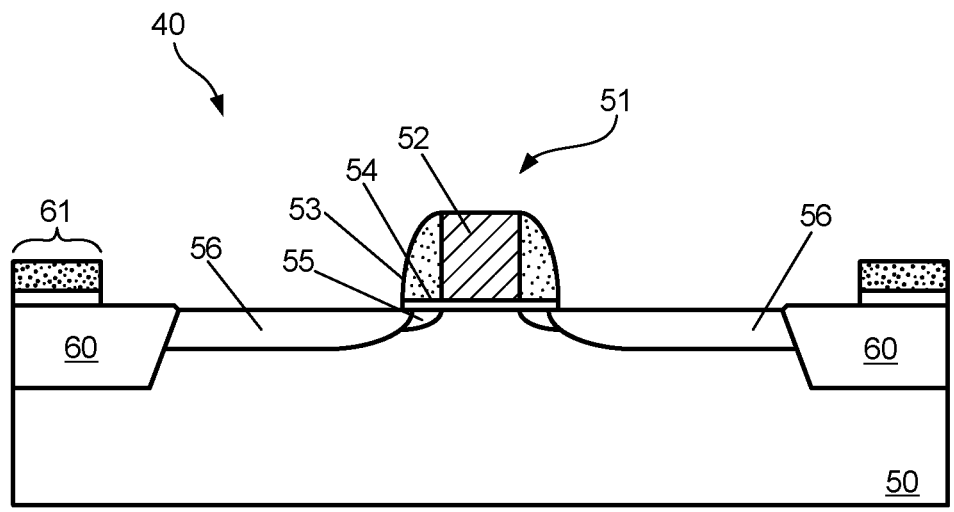
FIGS. 1A through 1E illustrate a method for silicide formation.

A method and system for silicide formation on a substrate using a gas cluster ion beam (GCIB) are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Referring now to the drawings wherein like reference numerals designate corresponding parts throughout the several views, a method of forming a silicide layer for use in a semiconductor device is described in FIGS. 1A through 1E according to several embodiments. The formation of the silicide layer may include a salicide (self-aligned silicide) process.

As shown in FIG. 1A, the semiconductor device, generally referred to as substrate 40, comprises a silicon-containing substrate 50 having a gate structure 51 formed thereon and therein. The substrate 50 may comprise single crystal silicon, poly-crystalline silicon, silicon-germanium ($SiGe_x$), silicon-carbon ($SiC_y$), or silicon-germanium-carbon ($SiGe_xC_y$), or any combination of two or more thereof, and wherein x and y are greater than or equal to 0. The gate structure 51 includes a gate electrode 52, a gate insulation layer 54, and a gate space layer 53. The gate electrode 52 may include one or more layers including, for example, one or more metal layers, one or more metal barrier layers, one or more doped poly-crystalline silicon layers, and one or more cap layers. The gate insulation layer 54 may include, for example, a conventional gate dielectric, such as silicon dioxide ($SiO_2$), or a high dielectric constant (high-k) dielectric layer. The gate spacer layer 53 may be composed of one or more material layers, including, for example, silicon oxide ($SiO_2$, or $SiO_x$) and/or silicon nitride ($Si_3N_4$, or $SiN_y$).

Also shown in FIG. 1A, the gate structure 51 further includes lightly-doped regions 55 and source/drain regions 56 formed in a surface region of the silicon-containing substrate 50 using ion implant and/or GCIB infusion processes. Isolation regions 60 having silicide blocking layers 61 may be formed adjacent the source/drain regions 56 to define the active region of substrate 50 therebetween.

Figure 1B:
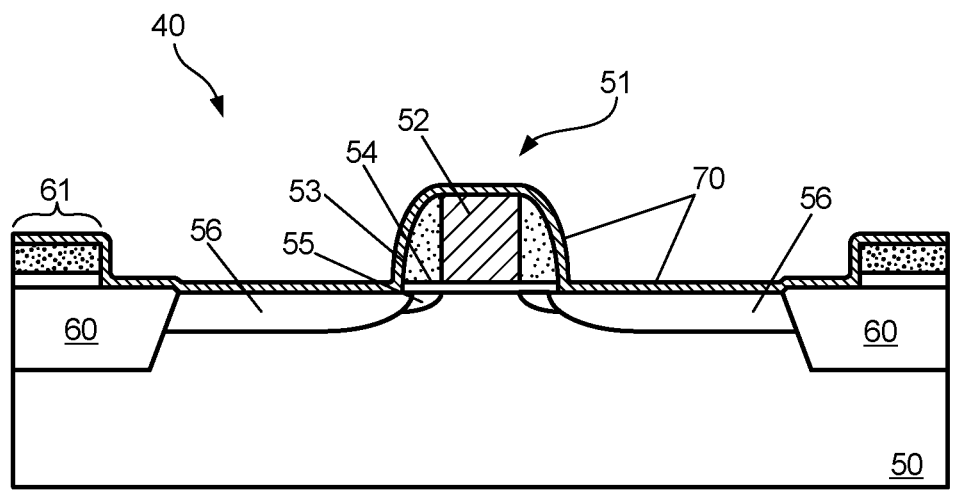

As shown in FIG. 1B, a metal-containing layer 70 is deposited over silicon-containing substrate 50, including over the source/drain regions 56 formed therein and over the portions of the gate structure 51 formed thereon. The metal-containing layer 70 may comprise tungsten, tantalum, zirconium, titanium, hafnium, platinum, palladium, vanadium, niobium, cobalt, nickel, or any alloy thereof. For example, the metal-containing layer 70 may comprise nickel or a nickel alloy, such as a nickel-platinum alloy. The metal-containing layer 70 may be deposited using a vapor deposition process, such as a physical vapor deposition (PVD) process or variations thereof, a chemical vapor deposition (CVD) process or variations thereof, or an atomic layer deposition (ALD) process or variations thereof. For example, nickel or a nickel alloy may be deposited using a PVD process. Prior to depositing the metal-containing layer 70, the substrate 40 may be cleaned using a dry and/or wet cleaning process to, for example, remove native oxide. Optionally, another metal-containing layer, such as titanium nitride (TiN) may be formed over the metal-containing layer 70.

Figure 1C:
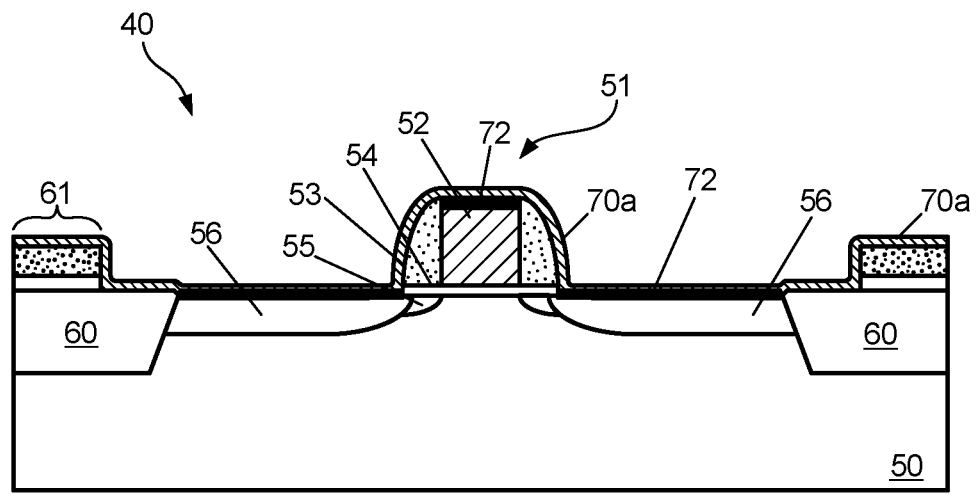

Following the deposition of the metal-containing layer 70, as shown in FIG. 1C, a portion of the metal-containing layer 70 is reacted with underlying portions of silicon-containing substrate 50 to form silicide regions 72. Specifically, in the embodiment shown, the portions of the silicon-containing substrate 50 that underlie the metal-containing layer 70 are the source/drain regions 56. Additionally, as shown, the underlying gate electrode 52 may also react to form a silicide region 72. The reaction between the metal-containing layer 70 and the silicon-containing substrate 50 (and optionally the gate electrode 52) may proceed immediately following deposition, and may further include a thermal process, such as a thermal anneal process. An un-reacted portion 70a of metal-containing layer 70 may remain.

Figure 1D:
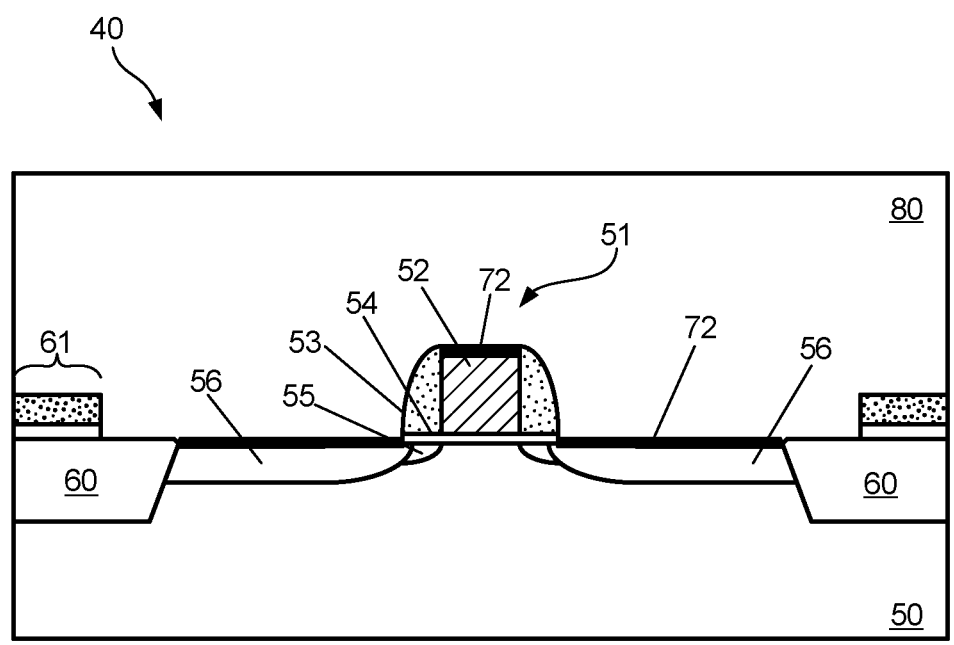

As shown in FIG. 1D, upon formation of silicide regions 72, the un-reacted portion 70a of the metal-containing layer 70 is removed from substrate 40 and a dielectric layer 80 is deposited on substrate 40 to serve as inter-layer insulation. The un-reacted portion 70a of metal-containing layer 70 may be removed from the substrate 40 using a cleaning or etching process, such as a dry or wet etching/cleaning process. Additionally, following this removal, the substrate 40 may be subjected to another thermal process, such as a thermal anneal process. The dielectric layer 80 may be deposited using a vapor deposition process, such as a physical vapor deposition (PVD) process or variations thereof, a chemical vapor deposition (CVD) or variations thereof, or an atomic layer deposition (ALD) process or variations thereof.

Figure 1E:
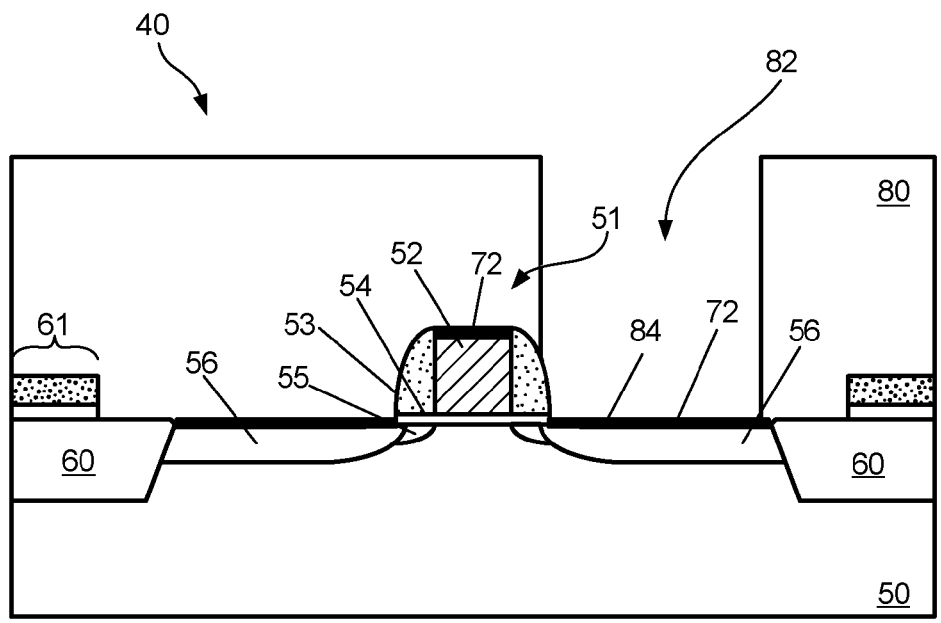

Thereafter, as shown in FIG. 1E, one or more via contacts 82 are prepared to expose contact surfaces 84. As shown, a contact surface 84 may be the surface of a silicide region 72 formed in the surface portion of a source/drain region 56 of silicon-containing substrate 50. The one or more via contacts 82 may be formed using a contact etch process, such as a dry etching process and/or a wet etching process.

According to embodiments of the invention, at least one portion of silicon-containing substrate 50 is exposed to one or more GCIB treatments before, during, or after any one of the process steps described in FIGS. 1A through 1E. The GCIB may be generated from a pressurized gas mixture that includes He, Ne, Ar, Xe, Kr, B, C, Si, Ge, N, P, As, O, S, F, Cl, or Br, or any combination of two or more thereof.

Figure 2A:
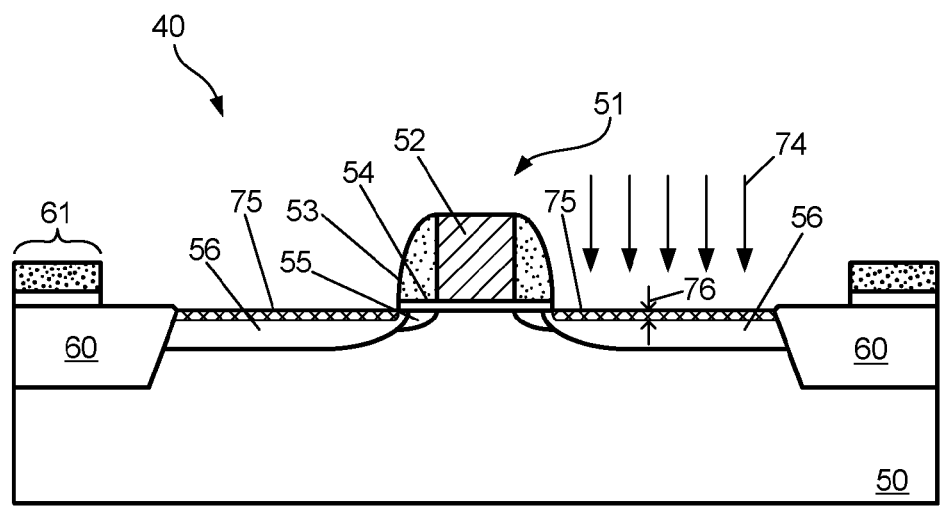
FIGS. 2A through 2C illustrate methods for altering the properties of silicide formation according to several embodiments.

According to one embodiment, at least one portion of silicon-containing substrate 50 of FIG. 1A is exposed to a GCIB 74 prior to deposition of the metal-containing layer 70, as shown in FIG. 2A, to enhance the subsequent formation of the silicide regions 72. The GCIB treatment may be utilized to modify, amorphize, and/or dope the exposed portion of silicon-containing substrate 50 to form mixed layer 75 having thickness 76. The GCIB 74 may be generated from a pressurized gas mixture that includes He, Ne, Ar, Xe, Kr, B, C, Si, Ge, N, P, As, O, S, F, Cl, or Br, or any combination of two or more thereof. The GCIB treatment may reduce defectivity in the formation of silicide regions 72. For example, the GCIB treatment may promote silicide formation that is preferentially composed of NiSi or Ni(Pt)Si. The GCIB treatment may amorphize the exposed portion of the silicon-containing substrate 50, or the GCIB treatment may alter the composition at the exposed portion of the silicon-containing substrate 50, or the GCIB treatment may amorphize and alter the composition at the exposed surface of the silicon-containing substrate 50. For example, the GCIB treatment may amorphize and/or increase silicon content at the exposed surface of the silicon-containing substrate 50, for example at the surface of the source/drain regions 56.

In a further embodiment, where the portion of silicon-containing substrate 50 includes a SiGe or SiGeC region in which the silicide will be formed, and where the GCIB 74 does not increase the silicon content in that region prior to depositing the metal-containing layer 70, another GCIB containing Si may be used after depositing the metal-containing layer 70 and before or after reacting the metal-containing layer 70 with the portion of silicon-containing substrate 50 to increase the proportion of Si in the SiGe or SiGeC region and thereby improve the silicide region formed therein.

Figure 2B:
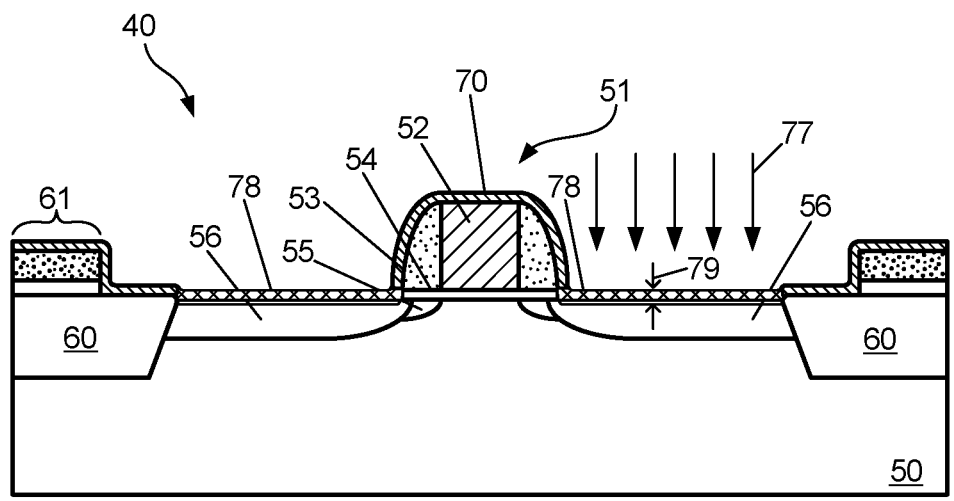
Figure 2C:
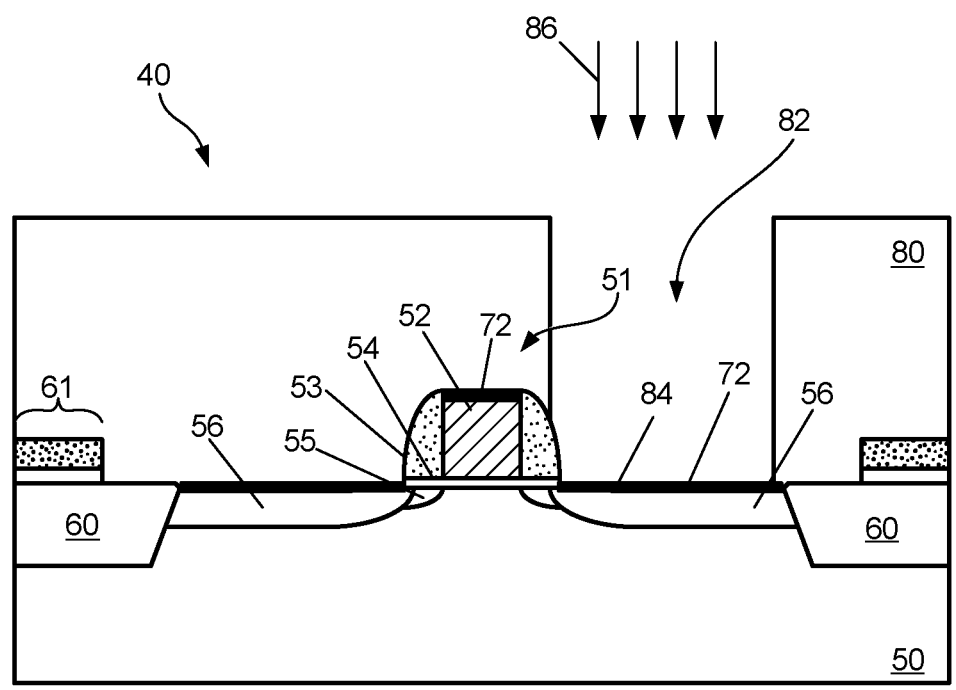

According to another embodiment, at least one portion of silicon-containing substrate 50 of FIG. 1B is exposed to a GCIB 77 following the deposition of the metal-containing layer 70, as shown in FIG. 2B, to enhance the formation of the silicide regions 72. The GCIB treatment may be utilized to modify, amorphize, and/or dope the portion of substrate 50, which is underlying metal-containing layer 70, to form mixed layer 78 having thickness 79. The GCIB 77 may be generated from a pressurized gas mixture that includes He, Ne, Ar, Xe, Kr, B, C, Si, Ge, N, P, As, O, S, F, Cl, or Br, or any combination of two or more thereof. The GCIB treatment may reduce defectivity in the formation of silicide regions 72. For example, the GCIB treatment may promote silicide formation that is preferentially composed of NiSi or Ni(Pt)Si. The GCIB may amorphize the portion of the silicon-containing substrate 50, or the GCIB treatment may alter the composition at the portion of the silicon-containing substrate 50, or the GCIB treatment may amorphize and alter the composition at the surface of the silicon-containing substrate 50. For example, the GCIB may amorphize and/or increase silicon content at the surface of the silicon-containing substrate 50, for example at the surface of the source/drain regions 56.

According to yet another embodiment, at least one portion of silicon-containing substrate 50 is exposed to a GCIB 86 following the formation of the one or more via contacts 82 to expose contact surfaces 84, which may be silicide regions 72. The GCIB treatment may be used to etch the contact surface 84, clean the contact surface 84, dope the contact surface 84, modify the contact surface 84, deposit material on the contact surface 84, or grow material on the contact surface 84, or any combination of two or more thereof. For example, the GCIB may be generated from a pressurized gas mixture that includes He, Ne, Ar, Xe, Kr, B, C, Si, Ge, N, P, As, O, S, F, Cl, or Br, or any combination of two or more thereof.

Figure 3:
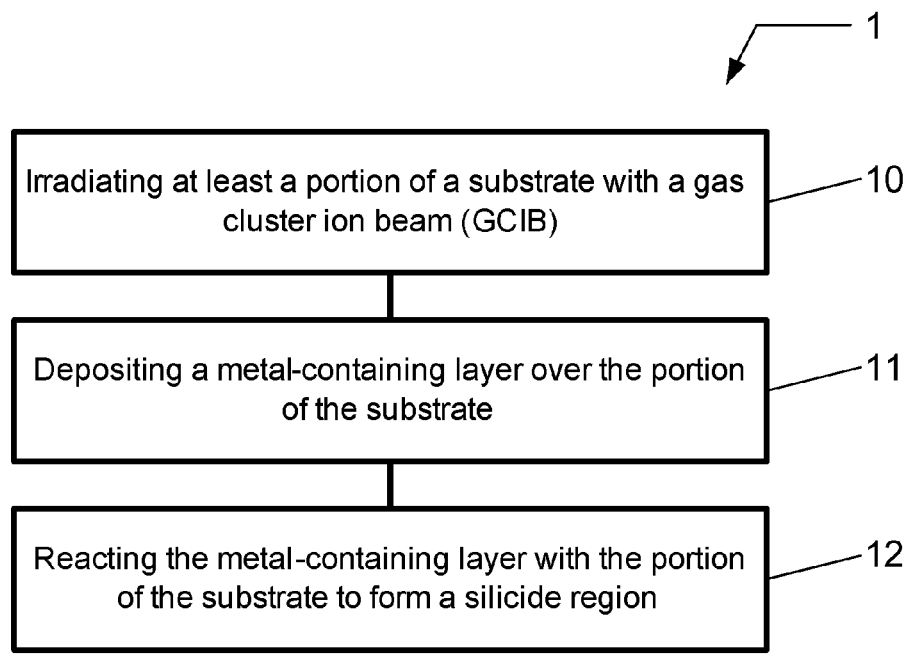
FIG. 3 is a flow chart illustrating a method of silicide formation on a substrate according to another embodiment.

Referring now to FIG. 3, a method for silicide formation on a substrate is described according to an embodiment. The method comprises a flow chart 1 beginning in 10 with irradiating at least a portion of a substrate with a gas cluster ion beam (GCIB) to modify, amorphize, and/or dope the portion of the substrate. The substrate may comprise single crystal silicon, poly-crystalline silicon, silicon-germanium ($SiGe_x$), silicon-carbon ($SiC_y$), or silicon-germanium-carbon ($SiGe_xC_y$), or any combination of two or more thereof, and wherein x and y are greater than or equal to 0.

The GCIB may be generated from a pressurized gas mixture that includes a noble gas (i.e., He, Ne, Ar, Kr, Xe). Additionally, the GCIB may be generated from a pressurized gas mixture that includes at least one element selected from the group consisting of He, Ne, Ar, Xe, Kr, B, C, Si, Ge, N, P, As, O, S, F, Cl, and Br. For example, the GCIB may include Si to increase silicon content at the portion of the substrate.

The GCIB may be used to form a mixed layer having a pre-determined thickness in the substrate. The mixed layer may be amorphous and promote greater penetration of the reaction between the metal-containing layer and the substrate. Additionally, the mixed layer may include one or more dopants and/or impurities infused using the GCIB. Furthermore, the mixed layer may include a concentration profile extending partly or fully through the mixed layer that is tailored via adjustment of one or more GCIB processing parameters of the GCIB.

In addition to irradiation of the substrate with the GCIB in 10, another GCIB may be used for additional control and/or function. Irradiation of the substrate by another GCIB may proceed before, during, or after use of the GCIB in 10. For example, another GCIB may be used to dope the portion of the substrate with an impurity. The doping may comprise introducing one or more elements selected from the group consisting of He, Ne, Ar, Xe, Kr, B, C, Si, Ge, N, P, As, O, S, F, Cl, and Br. For example, the another GCIB may include Si to increase silicon content at the portion of the substrate.

The portion of the substrate subjected to GCIB irradiation may be cleaned before or after the irradiating with the GCIB in 10. For example, the cleaning process may include a dry cleaning process and/or a wet cleaning process. Additionally, the portion of the substrate subjected to GCIB irradiation may be annealed after the irradiating with the GCIB in 10.

In 11, a metal-containing layer is deposited over the portion of the substrate following the irradiating with the GCIB in 10. The metal-containing layer may comprise tungsten, tantalum, zirconium, titanium, hafnium, platinum, palladium, vanadium, niobium, cobalt, nickel, or any alloy thereof. For example, the metal-containing layer may comprise nickel or a nickel alloy, such as nickel-platinum. Prior to depositing the metal-containing layer, the substrate may be cleaned using a dry and/or wet cleaning process to, for example, remove native oxide. Optionally, another metal-containing layer, such as titanium nitride (TiN) may be formed over the metal-containing layer.

In addition to irradiation of the substrate with the GCIB in 10, yet another GCIB may be used following the deposition of the metal-containing layer in 11. For example, the composition of the GCIB and/or one or more GCIB processing parameters may be tailored to modify a surface layer of the substrate and/or dope the substrate with an impurity.

In 12, a portion of the metal-containing layer is reacted with the portion of the substrate to form a silicide region. The reaction of the metal-containing layer with the substrate may comprise performing a thermal anneal process.

In addition to irradiation of the substrate with the GCIB in 10, yet another GCIB may be used to infuse material into the substrate following the deposition of the metal-containing layer in 11 and/or following the reacting of the metal-containing layer with the substrate in 12. For example, the another GCIB may include Si to increase silicon content at the portion of the substrate.

Thereafter, an un-reacted portion of the metal-containing layer is removed from the substrate following the reaction of the portion of the metal-containing layer with the substrate in 12. The removal of the un-reacted portion may be performed using a dry and/or wet cleaning/etching process. Following the removing, the substrate may be annealed using a thermal anneal process. A dielectric layer is formed on the substrate over the silicide region, and a contact etch process is performed above the silicide region to open a contact via through the dielectric layer to a contact surface of the silicide region.

The contact surface of the contact via may be irradiated with another GCIB to etch the contact surface, clean the contact surface, dope the contact surface, modify the contact surface, deposit material on the contact surface, or grow material on the contact surface, or any combination of two or more thereof.

Figure 4:
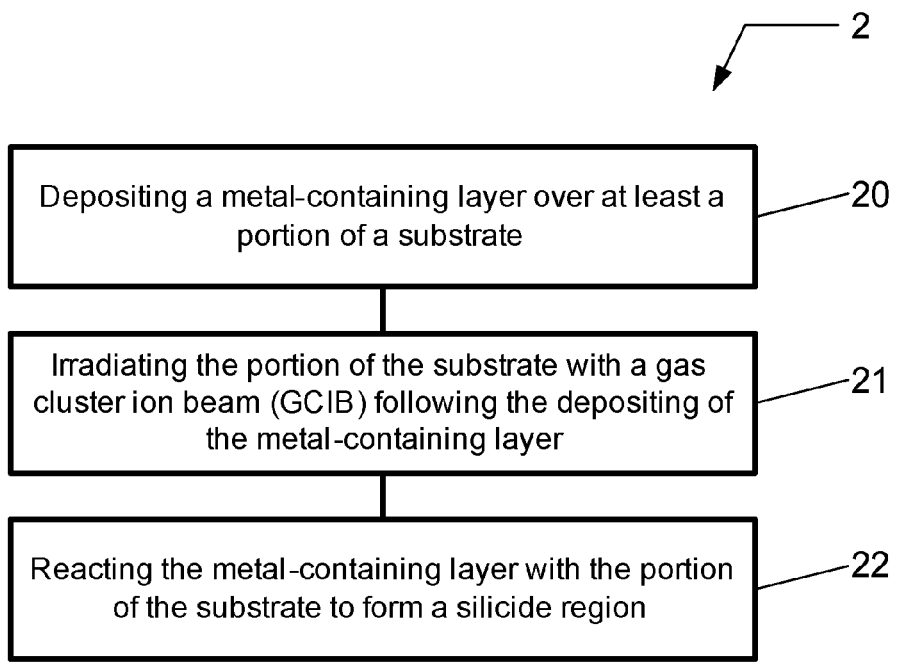
FIG. 4 is a flow chart illustrating a method of silicide formation on a substrate according to another embodiment.

Referring now to FIG. 4, a method for silicide formation on a substrate is described according to another embodiment. The method comprises a flow chart 2 beginning in 20 with depositing a metal-containing layer over at least a portion of a substrate. The substrate may comprise single crystal silicon, poly-crystalline silicon, silicon-germanium ($SiGe_x$), silicon-carbon ($SiC_y$), or silicon-germanium-carbon ($SiGe_xC_y$), or any combination of two or more thereof, and wherein x and y are greater than or equal to 0. The metal-containing layer may comprise tungsten, tantalum, zirconium, titanium, hafnium, platinum, palladium, vanadium, niobium, cobalt, nickel, or any alloy thereof. For example, the metal-containing layer may comprise nickel or a nickel alloy, such as nickel-platinum. Prior to depositing the metal-containing layer, the substrate may be cleaned using a dry and/or wet cleaning process to, for example, remove native oxide. Optionally, another metal-containing layer, such as titanium nitride (TiN) may be formed over the metal-containing layer.

In 21, the portion of the substrate is irradiated with a gas cluster ion beam (GCIB). The GCIB may be generated from a pressurized gas mixture that includes a noble gas (i.e., He, Ne, Ar, Kr, Xe). Additionally, the GCIB may be generated from a pressurized gas mixture that includes at least one element selected from the group consisting of He, Ne, Ar, Xe, Kr, B, C, Si, Ge, N, P, As, O, S, F, Cl, and Br. For example, the GCIB may include Si to increase silicon content at the portion of the substrate.

The GCIB may be used to form a mixed layer having a pre-determined thickness in the substrate. The mixed layer may be amorphous and promote greater penetration of the reaction between the metal-containing layer and the substrate. Additionally, the mixed layer may include one or more dopants and/or impurities infused using the GCIB. Furthermore, the mixed layer may include a concentration profile extending partly or fully through the mixed layer that is tailored via adjustment of one or more GCIB processing parameters of the GCIB.

In addition to irradiation of the substrate with the GCIB in 21, another GCIB may be used for additional control and/or function. Irradiation of the substrate by another GCIB may proceed before, during, or after use of the GCIB in 21. For example, another GCIB may be used to dope the portion of the substrate with an impurity. The doping may comprise introducing one or more elements selected from the group consisting of He, Ne, Ar, Xe, Kr, B, C, Si, Ge, N, P, As, O, S, F, Cl, and Br. For example, the GCIB may include Si to increase silicon content at the portion of the substrate.

The portion of the substrate subjected to GCIB irradiation may be cleaned before or after the irradiating with the GCIB in 21. For example, the cleaning process may include a dry cleaning process and/or a wet cleaning process. Additionally, the portion of the substrate subjected to GCIB irradiation may be annealed after the irradiating with the GCIB in 21.

In addition to irradiation of the substrate with the GCIB in 21, yet another GCIB may be used preceding the deposition of the metal-containing layer in 20. For example, the composition of the GCIB and/or one or more GCIB processing parameters may be tailored to modify a surface layer of the substrate, or dope the substrate with an impurity. For example, the another GCIB may include Si to increase silicon content at the portion of the substrate. Additionally, for example, the another GCIB may include a noble gas element to amorphize the portion of the substrate.

In 22, a portion of the metal-containing layer is reacted with the portion of the substrate to form a silicide region. The reaction of the metal-containing layer with the substrate may comprise performing a thermal anneal process. Additionally, the reaction in 22 may proceed before, during or after the irradiating of the portion of the substrate with the GCIB in 21.

In addition to irradiation of the substrate with the GCIB in 21, yet another GCIB may be used to infuse material into the substrate following the reacting of the metal-containing layer with the substrate in 22. For example, the another GCIB may include Si to increase silicon content at the portion of the substrate.

Thereafter, an un-reacted portion of the metal-containing layer is removed from the substrate following the reaction of the portion of the metal-containing layer with the substrate in 22. The removal of the un-reacted portion may be performed using a dry and/or wet cleaning/etching process. Following the removing, the substrate may be annealed using a thermal anneal process. A dielectric layer is formed on the substrate over the silicide region, and a contact etch process is performed above the silicide region to open a contact via through the dielectric layer to a contact surface of the silicide region.

The contact surface of the contact via may be irradiated with another GCIB to etch the contact surface, clean the contact surface, dope the contact surface, modify the contact surface, deposit material on the contact surface, or grow material on the contact surface, or any combination of two or more thereof.

Figure 5:
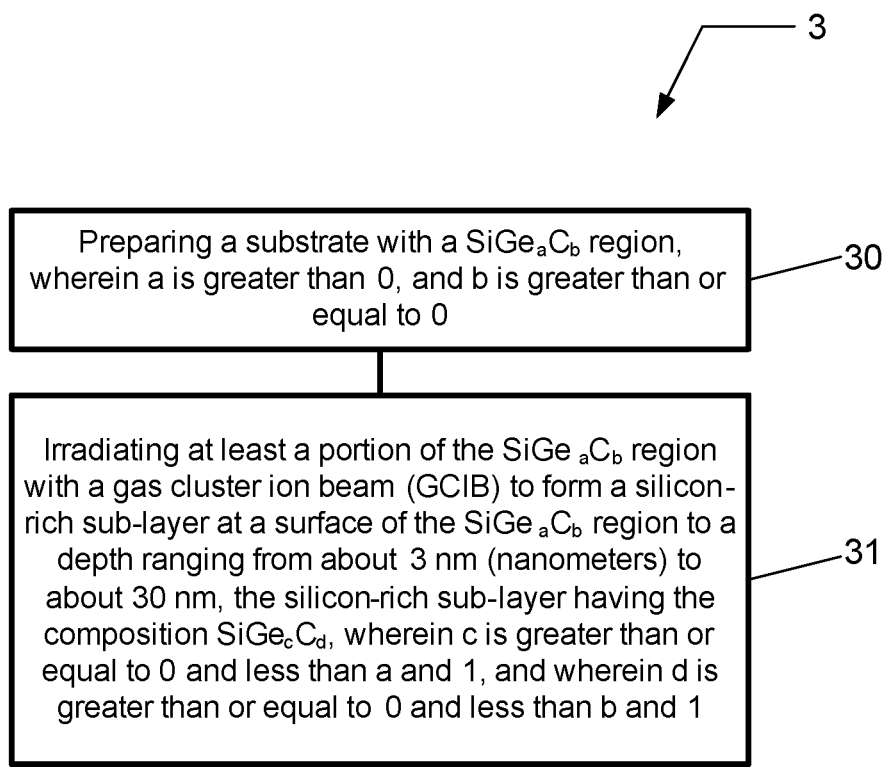
FIG. 5 is a flow chart illustrating a method of silicide formation on a substrate according to yet another embodiment.

Referring now to FIG. 5, a silicidation process for silicide formation on a substrate is described according to yet another embodiment. The method comprises a flow chart 3 beginning in 30 with preparing a substrate with a $SiGe_aC_b$ region, wherein a is greater than 0, and b is greater than or equal to 0.

In 31, at least a portion of the $SiGe_aC_b$ region is irradiated with a gas cluster ion beam (GCIB) to form a silicon-rich sub-layer at a surface of the $SiGe_aC_b$ region. The irradiation may proceed to form the silicon-rich sub-layer to a depth ranging from about 3 nm to about 30 nm. The silicon-rich sub-layer has the composition $SiGe_cC_d$, wherein c is greater than or equal to 0 and less than a and 1, and wherein d is greater than or equal to 0 and less than b and 1.

The inventors believe that increasing silicon content (i.e., increasing the proportion of Si in SiGe or SiGeC) at a surface portion of the substrate improves the thermal stability of $SiGe_aC_b$-silicides, such as $SiGe_a$-silicides (where b is zero). The temperature stability of $SiGe_aC_b$-silicides degrades with increased Ge concentration. Therefore, a GCIB may be used to infuse silicon in the surface layer of the substrate to produce a silicon-rich sub-layer. This infusion process may precede the formation of a silicide layer or follow the formation of the silicide layer.

The GCIB may be generated from a pressurized gas mixture that includes Si. For example, the GCIB may be generated from a pressurized gas mixture that includes silane, disilane, an alkyl silane, an alkane silane, an alkene silane, an alkyne silane, methylsilane ($H_3C$—$SiH_3$), dimethylsilane ($H_3C$—$SiH_2$—$CH_3$), trimethylsilane (($CH_3)_3$—$SiH$), or tetramethylsilane (($CH_3)_4$—$Si$), or any combination of two or more thereof. Additionally, the GCIB may further include one or more elements selected from the group consisting of He, Ne, Ar, Xe, Kr, B, C, Ge, N, P, As, O, S, F, Cl, and Br.

A cleaning step and/or an annealing step may be inserted before or after any one of the process steps described above.

As described above, one or more GCIB treatments may be performed to modify and/or enhance a material property of a substrate during a silicide process. For any one of these GCIB treatments, a GCIB operation may comprise: establishing a GCIB; selecting a beam energy, a beam energy distribution, a beam focus, and a beam dose; accelerating the GCIB to achieve the beam energy; focusing the GCIB to achieve the beam focus; and exposing the portion of the substrate to the accelerated GCIB according to the beam dose. The GCIB treatment may further comprise selecting the beam energy and the beam dose to achieve a desired thickness of a mixed layer formed during irradiating the portion of the substrate with the GCIB.

A GCIB may be established having an energy per atom ratio ranging from about 0.25 eV per atom to about 100 eV per atom. Alternatively, the GCIB may be established having an energy per atom ratio ranging from about 0.25 eV per atom to about 10 eV per atom. Alternatively, the GCIB may be established having an energy per atom ratio ranging from about 1 eV per atom to about 10 eV per atom. The GCIB can be formed in a GCIB processing system, such as any of the GCIB processing systems (100, 100' or 100") described below in FIG. 5, 6 or 7, or any combination thereof.

The substrate to be treated may be provided in a reduced-pressure environment in a GCIB processing system. The substrate may be positioned on a substrate holder and may be securely held by the substrate holder. The temperature of the substrate may or may not be controlled. For example, the substrate may be heated or cooled during a film forming process. The environment surrounding the substrate is maintained at a reduced pressure.

A GCIB may be generated in the reduced-pressure environment, and can be generated from a pressurized gas mixture. The pressurized gas mixture may use a material source comprising one or more gases containing elements selected from the group consisting of He, Ne, Ar, Kr, Xe, B, C, Si, Ge, N, P, As, O, S, F, and Cl. For example, the material source may comprise He, Ne, Ar, Kr, Xe, $SiH_4$, $Si_2H_6$, $SiH_2Cl_2$, $SiCl_3H$, methylsilane, dimethylsilane, trimethylsilane, tetramethylsilane, ethylsilane, diethylsilane, triethylsilane, tetraethylsilane, $SiCl_4$, $SiF_4$, $GeH_4$, $Ge_2H_6$, $GeH_2Cl_2$, $GeCl_3H$, methylgermane, dimethylgermane, trimethylgermane, tetramethylgermane, ethylgermane, diethylgermane, triethylgermane, tetraethylgermane, $GeCl_4$, $GeF_4$, $N_2$, $H_2$, $O_2$, NO, $NO_2$, $N_2O$, $NH_3$, $NF_3$, HCl, $SF_6$, CO, $CO_2$, $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, $C_6H_{12}$, $BF_3$, $B_2H_6$, $AsH_3$, $AsF_5$, $PH_3$, $PF_3$, $PCl_3$, or $PF_5$, or any combination of two or more thereof.

A beam acceleration potential, a beam dose, and/or a cluster size can be selected. The beam acceleration potential, the beam dose, and/or the cluster size can be selected to achieve pre-specified properties of the substrate. For example, the beam acceleration potential, cluster size, and/or beam dose may be adjusted to alter the material properties of the substrate, i.e., as will be described below, alter a concentration of one or more species within the substrate, a concentration profile of one or more species within the substrate, or depth of one or more species within the substrate, or any combination thereof. The beam acceleration potential may range up to 100 kV, the cluster size may range up to several tens of thousands of atoms, and the beam dose may range up to about $1\times10^{17}$ clusters per $cm^2$. For example, the beam acceleration potential may range from about 1 kV to about 70 kV (i.e., the beam energy may range from about 1 keV to about 70 keV). Additionally, for example, the beam dose may range from about $1\times10^{15}$ clusters per $cm^2$ to about $1\times10^{17}$ clusters per $cm^2$.

The beam acceleration potential may be used to modify the depth of penetration of the one or more elements in the substrate, i.e., increasing the beam acceleration potential increases the depth and decreasing the beam acceleration potential decreases the depth. Additionally, the beam dose may be used to modify the concentration of the one or more elements in the substrate, i.e., increasing the beam dose increases the final concentration and decreasing the beam dose decrease the final concentration. The GCIB is accelerated according to the beam acceleration potential, and the substrate is exposed to the GCIB according to the beam dose.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

Furthermore, the energy per atom ratio may be used to adjust the concentration of one or more elements present or not present in the material layer and/or the depth to which the one or more elements are present in the material layer. For instance, while decreasing the energy per atom ratio, the adjusted depth may be decreased. Alternatively, while increasing the energy per atom ratio, the adjusted depth may be increased.

The establishment of the GCIB having a desired energy per atom ratio may include selection of a beam acceleration potential, a stagnation pressure for formation of the GCIB, or a gas flow rate, or any combination thereof. The beam acceleration potential may be used to increase or decrease the beam energy or energy per ion cluster. For example, an increase in the beam acceleration potential causes an increase in the maximum beam energy and, consequently, an increase in the energy per atom ratio for a given cluster size. Additionally, the stagnation pressure may be used to increase or decrease the cluster size for a given cluster. For example, an increase in the stagnation pressure during formation of the GCIB causes an increase in the cluster size (i.e., number of atoms per cluster) and, consequently, a decrease in the energy per atom ratio for a given beam acceleration potential.

Additionally yet, other GCIB properties may be varied to adjust the amorphizing, doping or modification of the substrate including, but not limited to, beam energy distribution, cluster size distribution, or gas nozzle design (such as nozzle throat diameter, nozzle length, and/or nozzle divergent section half-angle).

Furthermore, as described above, one or more thermal anneals may be performed to modify and/or enhance a material property of a substrate during a silicide process. For any one of these thermal anneals, the substrate may be subjected to a thermal treatment, wherein the temperature of the substrate is elevated to a material-specific temperature for a period of time. The temperature and the time for the annealing process may be adjusted in order to vary the properties of the substrate. For example, the temperature of the substrate may be elevated to a value greater than about 800 degrees C. Additionally, for example, the temperature of the substrate may be elevated to a value greater than about 850 degrees C. Additionally yet, for example, the temperature of the substrate may be elevated to a value greater than about 900 degrees C. Furthermore, for example, the time for the annealing process may be greater than about 1 millisecond. The annealing process may be performed at atmospheric pressure or reduced pressure. Additionally, the annealing process may be performed with or without an inert gas atmosphere. Furthermore, the annealing process may be performed in a furnace, a rapid thermal annealing (RTP) system, a flash lamp annealing system, or a laser annealing system.

Figure 6:
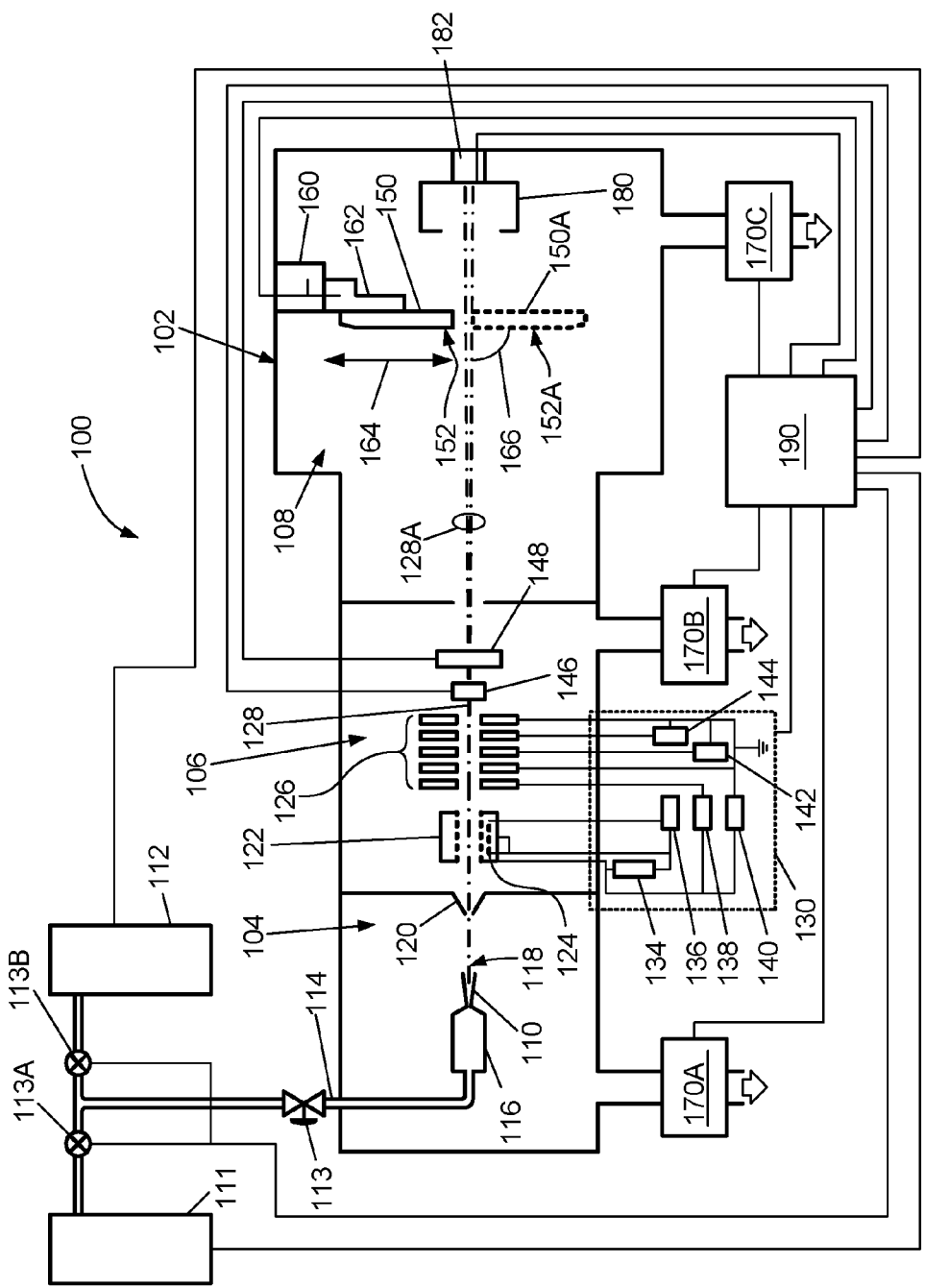
FIG. 6 is an illustration of a GCIB processing system.

Referring now to FIG. 6, a GCIB processing system 100 for treating a substrate as described above is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 6, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

Although specific examples are provided for transistor gate and trench capacitor applications, the methods of etching, as described above, may be utilized in any substrate processing wherein etching is necessitated.

As shown in FIG. 6, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The material composition can include the principal atomic or molecular species of the elements desired to be introduced to the material layer.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 6, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 6, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 6, the beam electronics 130 include an extraction power supply 138 that provides voltage $V_{EE}$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{ACC}$ to bias one of the high voltage electrodes 126 with respect to the ionizer 122 so as to result in a total GCIB acceleration energy equal to about $V_{ACC}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{ACC}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 6, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 5, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 6, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 7:
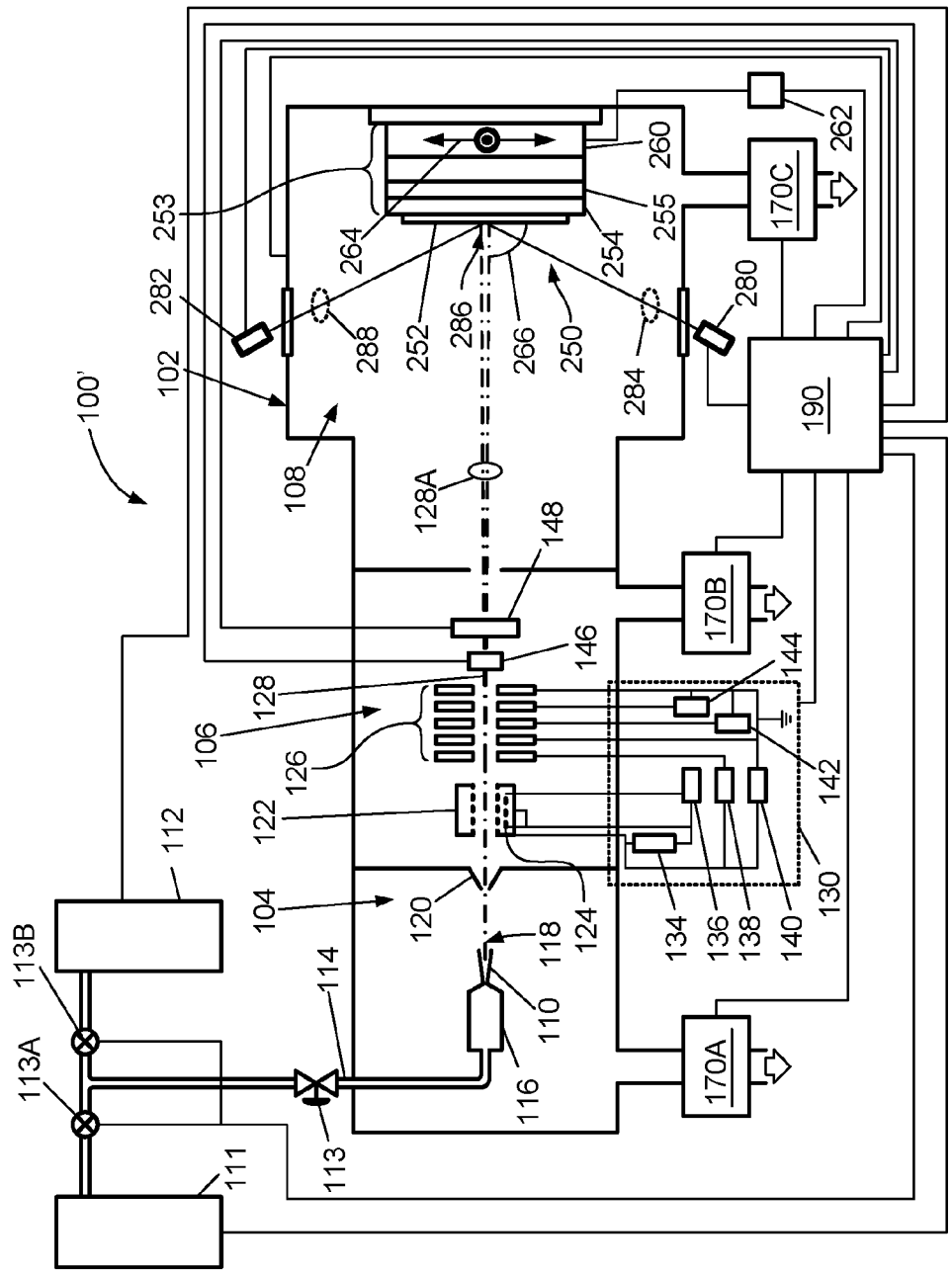
FIG. 7 is another illustration of a GCIB processing system.

In the embodiment shown in FIG. 7, the GCIB processing system 100' can be similar to the embodiment of FIG. 6 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 6) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 8:
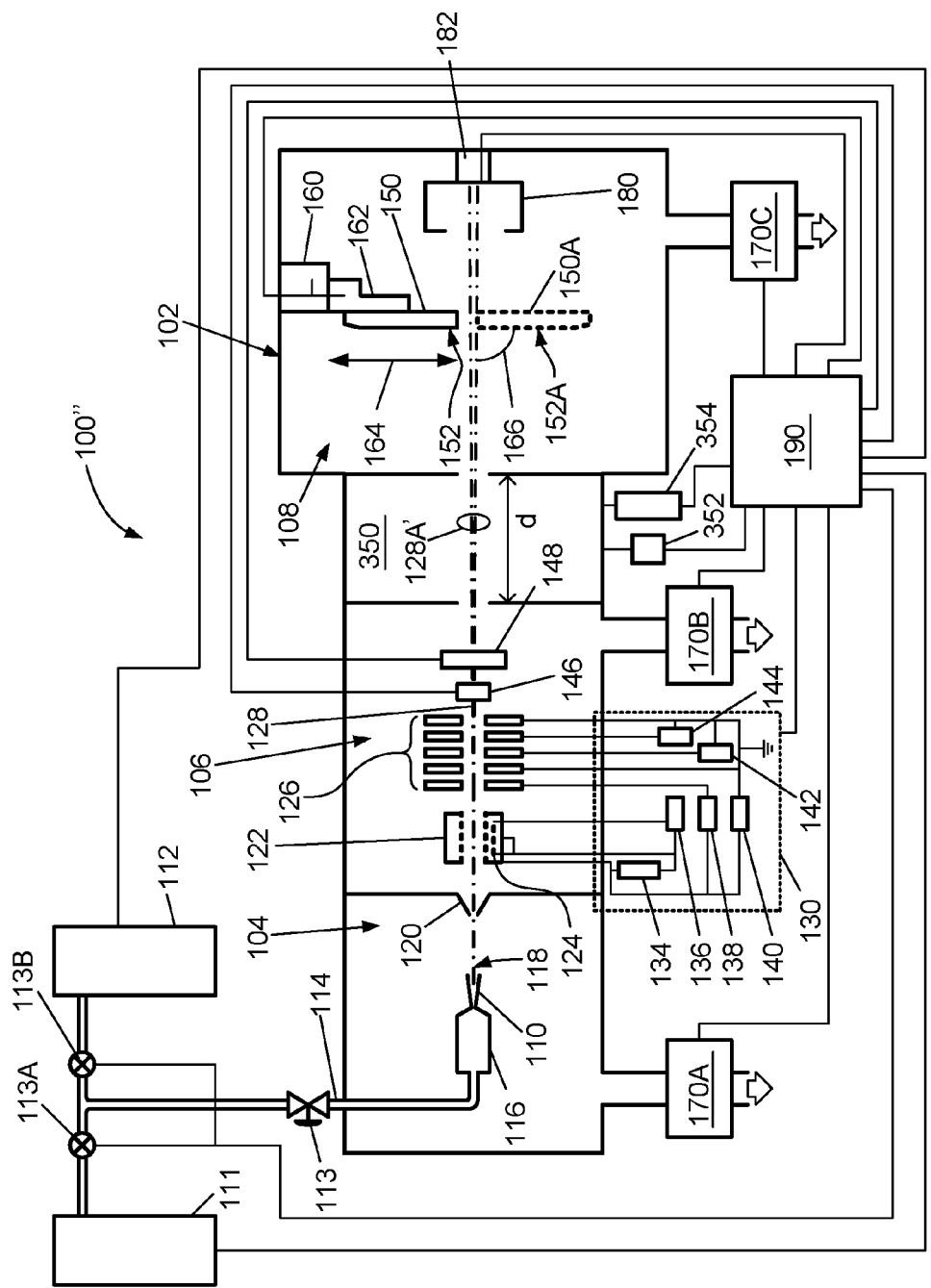
FIG. 8 is yet another illustration of a GCIB processing system.

In the embodiment shown in FIG. 8, the GCIB processing system 100" can be similar to the embodiment of FIG. 6 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 9:
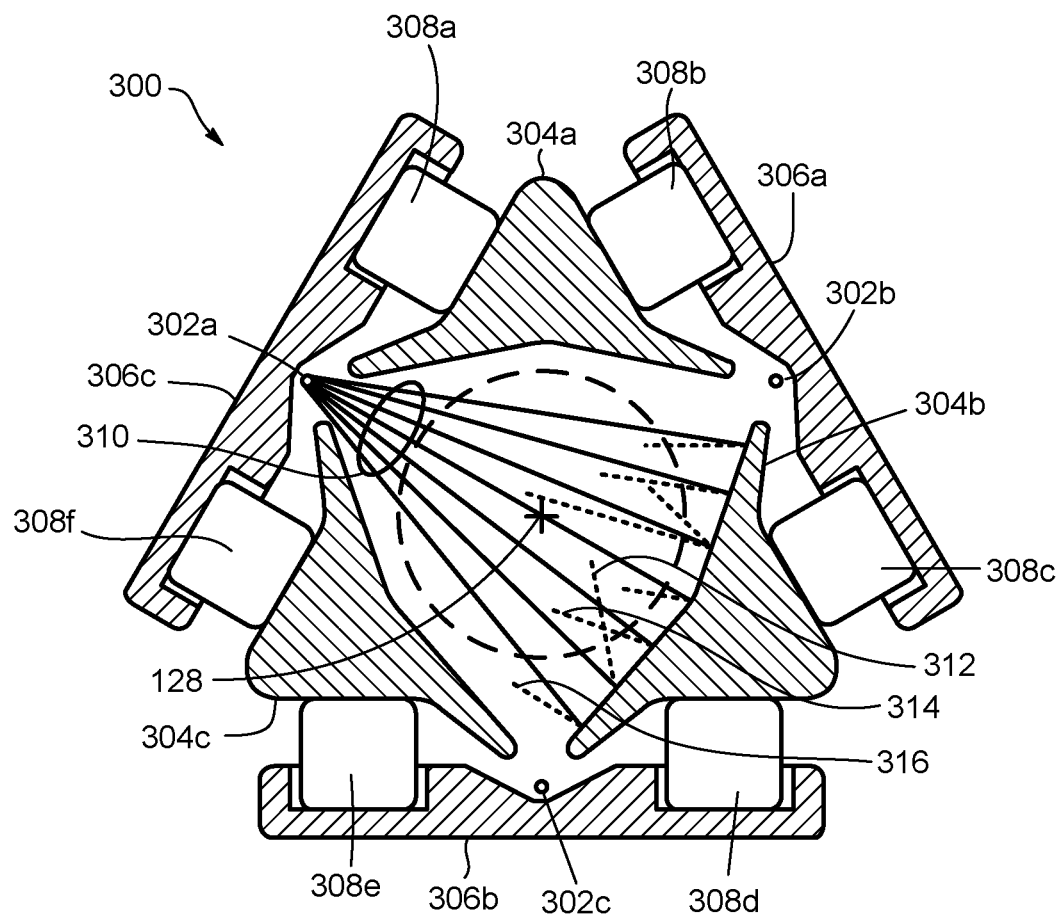
FIG. 9 is an illustration of an ionization source for a GCIB processing system.

Referring now to FIG. 9, a section 300 of a gas cluster ionizer (122, FIGS. 6, 7 and 8) for ionizing a gas cluster jet (gas cluster beam 118, FIGS. 6, 7 and 8) is shown. The section 300 is normal to the axis of GCIB 128. For typical gas cluster sizes (2000 to 15000 atoms), clusters leaving the skimmer aperture (120, FIGS. 6, 7 and 8) and entering an ionizer (122, FIGS. 6, 7 and 8) will travel with a kinetic energy of about 130 to 1000 electron volts (eV). At these low energies, any departure from space charge neutrality within the ionizer 122 will result in a rapid dispersion of the jet with a significant loss of beam current. FIG. 9 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Figure 10:
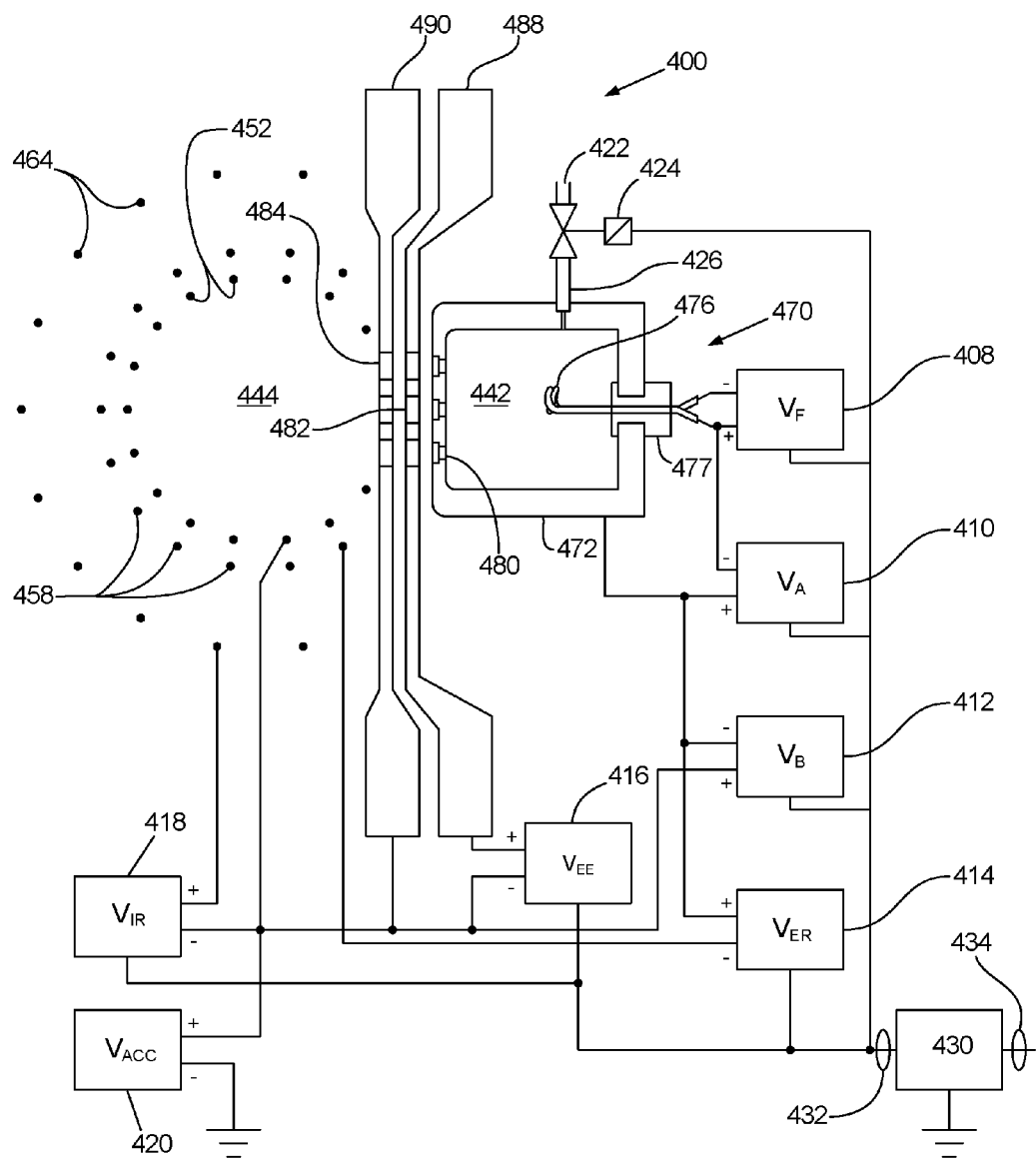
FIG. 10 is an illustration of another ionization source for a GCIB processing system.

Alternatively, ionizers may use electron extraction from plasma to ionize clusters. The geometry of these ionizers is quite different from the three filament ionizer described above but the principles of operation and the ionizer control are very similar. Referring now to FIG. 10, a section 400 of a gas cluster ionizer (122, FIGS. 6, 7 and 8) for ionizing a gas cluster jet (gas cluster beam 118, FIGS. 6, 7 and 8) is shown. The section 400 is normal to the axis of GCIB 128. For typical gas cluster sizes (2000 to 15000 atoms), clusters leaving the skimmer aperture (120, FIGS. 6, 7 and 8) and entering an ionizer (122, FIGS. 6, 7 and 8) will travel with a kinetic energy of about 130 to 1000 electron volts (eV). At these low energies, any departure from space charge neutrality within the ionizer 122 will result in a rapid dispersion of the jet with a significant loss of beam current. FIG. 10 illustrates a self-neutralizing ionizer. As with other ionizers, gas clusters are ionized by electron impact.

The ionizer includes an array of thin rod anode electrodes 452 that is supported and electrically connected by a support plate (not shown). The array of thin rod anode electrodes 452 is substantially concentric with the axis of the gas cluster beam (e.g., gas cluster beam 118, FIGS. 6, 7 and 8). The ionizer also includes an array of thin rod electron-repeller rods 458 that is supported and electrically connected by another support plate (not shown). The array of thin rod electron-repeller electrodes 458 is substantially concentric with the axis of the gas cluster beam (e.g., gas cluster beam 118, FIGS. 6, 7 and 8). The ionizer further includes an array of thin rod ion-repeller rods 464 that is supported and electrically connected by yet another support plate (not shown). The array of thin rod ion-repeller electrodes 464 is substantially concentric with the axis of the gas cluster beam (e.g., gas cluster beam 118, FIGS. 6, 7 and 8).

Energetic electrons are supplied to a beam region 444 from a plasma electron source 470. The plasma electron source 470 comprises a plasma chamber 472 within which plasma is formed in plasma region 442. The plasma electron source 470 further comprises a thermionic filament 476, a gas entry aperture 426, and a plurality of extraction apertures 480. The thermionic filament 476 is insulated from the plasma chamber 470 via insulator 477. As an example, the thermionic filament 476 may include a tungsten filament having one-and-a-half turns in a "pigtail" configuration.

The section 400 of the gas cluster ionizer comprises an electron-acceleration electrode 488 having plural apertures 482. Additionally, the section 400 comprises an electron-deceleration electrode 490 having plural apertures 484. The plural apertures 482, the plural apertures 484, and the plural extraction apertures 480 are all aligned from the plasma region 442 to the beam region 444.

Plasma forming gas, such as a noble gas, is admitted to the plasma chamber 472 through gas entry aperture 426. An insulate gas feed line 422 provides pressurized plasma forming gas to a remotely controllable gas valve 424 that regulates the admission of plasma forming gas to the plasma chamber 472.

A filament power supply 408 provides filament voltage ($V_F$) for driving current through thermionic filament 476 to stimulate thermo-electron emission. Filament power supply 408 controllably provides about 140 to 200 A (amps) at 3 to 5 V (volts). An arc power supply 410 controllably provides an arc voltage ($V_A$) to bias the plasma chamber 472 positive with respect to the thermionic filament 476. Arc power supply 410 is typically operated at a fixed voltage, typically about 35 V, and provides means for accelerating the electrons within the plasma chamber 472 for forming plasma. The filament current is controlled to regulate the arc current supplied by the arc power supply 410. Arc power supply 410 is capable of providing up to 5 A arc current to the plasma arc.

Electron deceleration electrode 490 is biased positively with respect to the plasma chamber 472 by electron bias power supply 412. Electron bias power supply 412 provides bias voltage ($V_B$) that is controllably adjustable over the range of from 30 to 400 V. Electron acceleration electrode 488 is biased positively with respect to electron deceleration electrode 490 by electron extraction power supply 416. Electron extraction power supply 416 provides electron extraction voltage ($V_{EE}$) that is controllable in the range from 20 to 250 V. An acceleration power supply 420 supplies acceleration voltage ($V_{ACC}$) to bias the array of thin rod anode electrodes 452 and electron deceleration electrode 490 positive with respect to earth ground. $V_{ACC}$ is the acceleration potential for gas cluster ions produced by the gas cluster ionizer shown in section 400 and is controllable and adjustable in the range from 1 to 100 kV. An electron repeller power supply 414 provides electron repeller bias voltage ($V_{ER}$) for biasing the array of thin rod electron-repeller electrodes 458 negative with respect to $V_{ACC}$. $V_{ER}$ is controllable in the range of from 50 to 100 V. An ion repeller power supply 418 provides ion repeller bias voltage ($V_{IR}$) to bias the array of thin rod ion-repeller electrodes 464 positive with respect to $V_{ACC}$. $V_{IR}$ is controllable in the range of from 50 to 150 V.

A fiber optics controller 430 receives electrical control signals on cable 434 and converts them to optical signals on control link 432 to control components operating at high potentials using signals from a grounded control system. The fiber optics control link 432 conveys control signals to remotely controllable gas valve 424, filament power supply 408, arc power supply 410, electron bias power supply 412, electron repeller power supply 414, electron extraction power supply 416, and ion repeller power supply 418.

For example, the ionizer design may be similar to the ionizer described in U.S. Pat. No. 7,173,252, entitled "Ionizer and method for gas-cluster ion-beam formation"; the content of which is incorporated herein by reference in its entirety.

The gas cluster ionizer (122, FIGS. 6, 7 and 8) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for forming a silicide contact surface on a substrate, comprising:
   reacting a metal-containing layer with an underlying portion of a silicon-containing substrate to form a silicide region;
   forming a dielectric layer over the silicide region;
   performing a contact etch process to open a contact via through the dielectric layer to a contact surface of the silicide region;
   irradiating said contact surface with a gas cluster ion beam (GCIB) to clean said contact surface, etch said contact surface, dope said contact surface, modify said contact surface, deposit material on said contact surface, or grow material on said contact surface, or any combination thereof; and
   exposing said silicon-containing substrate to another GCIB prior to said reacting to enhance formation of said silicide region during said reacting.

2. The method of claim 1, further comprising:
   exposing said silicon-containing substrate to another GCIB after said reacting and prior to forming said dielectric layer to modify said silicide region.

3. The method of claim 1, wherein said metal-containing layer comprises tungsten, tantalum, zirconium, titanium, hafnium, platinum, palladium, vanadium, niobium, cobalt, nickel, or any alloy thereof.

4. The method of claim 1, further comprising:
   generating said GCIB from a pressurized gas mixture that includes one or more gases containing elements selected from the group consisting of He, Ne, Ar, Kr, Xe, B, C, Si, Ge, N, P, As, O, S, F, and Cl.

5. The method of claim 1, wherein said silicon-containing substrate comprises single crystal silicon, poly-crystalline silicon, silicon-germanium (SiGe), silicon carbide (SiC), or silicon-germanium-carbon (SiGeC), or any combination of two or more thereof.

6. The method of claim 5, wherein said silicon-containing substrate includes a gate structure formed thereon, and wherein said underlying portion of said silicon-containing substrate includes a source/drain region of said gate structure, wherein said exposing said silicon-containing substrate to another GCIB prior to said reacting increases silicon content at a surface of said source/drain region to enhance formation of said silicide region.

7. A method for cleaning material on a substrate, comprising:
   providing a substrate having a dielectric layer over a silicide region;
   forming an opening in said dielectric layer by exposing said dielectric layer to an etching process;

irradiating an exposed surface within said opening with a gas cluster ion beam (GCIB) to clean said exposed surface; and exposing said substrate to another GCIB prior to forming said opening to enhance formation of said silicide region.

8. The method of claim 7, further comprising:
exposing said substrate to another GCIB prior to forming said opening to modify said silicide region.

9. The method of claim 7, further comprising:
generating said GCIB from a pressurized gas mixture that includes one or more gases containing elements selected from the group consisting of He, Ne, Ar, Kr, Xe, B, C, Si, Ge, N, P, As, O, S, F, and Cl.

10. The method of claim 7, wherein said substrate comprises single crystal silicon, poly-crystalline silicon, silicon-germanium (SiGe), silicon carbide (SiC), or silicon-germanium-carbon (SiGeC), or any combination of two or more thereof.

11. The method of claim 7, wherein said substrate includes a gate structure formed thereon, and wherein said silicide region includes a source/drain region of said gate structure.

12. The method of claim 11, further comprising:
exposing said substrate to another GCIB prior to forming said opening to increase silicon content at a surface of said source/drain region to enhance formation of or to modify said silicide region.

13. A method for forming a silicide contact surface on a substrate, comprising:
reacting a metal-containing layer with an underlying portion of a silicon-containing substrate to form a silicide region;

forming a dielectric layer over the silicide region;

performing a contact etch process to open a contact via through the dielectric layer to a contact surface of the silicide region;

irradiating said contact surface with a gas cluster ion beam (GCIB) to clean said contact surface, etch said contact surface, dope said contact surface, modify said contact surface, deposit material on said contact surface, or grow material on said contact surface, or any combination thereof; and exposing said silicon-containing substrate to another GCIB after said reacting and prior to forming said dielectric layer to modify said silicide region.

14. The method of claim 13, wherein said metal-containing layer comprises tungsten, tantalum, zirconium, titanium, hafnium, platinum, palladium, vanadium, niobium, cobalt, nickel, or any alloy thereof.

15. The method of claim 13, further comprising:
generating said GCIB from a pressurized gas mixture that includes one or more gases containing elements selected from the group consisting of He, Ne, Ar, Kr, Xe, B, C, Si, Ge, N, P, As, O, S, F, and Cl.

16. The method of claim 13, wherein said silicon-containing substrate comprises single crystal silicon, poly-crystalline silicon, silicon-germanium (SiGe), silicon carbide (SiC), or silicon-germanium-carbon (SiGeC), or any combination of two or more thereof.

17. The method of claim 16, wherein said silicon-containing substrate includes a gate structure formed thereon, and wherein said underlying portion of said silicon-containing substrate includes a source/drain region of said gate structure.

* * * * *